(12) United States Patent
Iotti et al.

(10) Patent No.: US 12,744,503 B2
(45) Date of Patent: Sep. 22, 2026

(54) METHOD FOR VARYING AMPLIFIER GAIN

(71) Applicant: Nokia Solutions and Networks Oy, Espoo (FI)

(72) Inventors: Lorenzo Iotti, Brooklyn, NY (US); Mark Ferriss, Tarrytown, NY (US); Alexander Rylyakov, Staten Island, NY (US)

(73) Assignee: Nokia Solutions and Networks Oy, Espoo (FI)

( * ) Notice: Subject to any disclaimer, the term of this patent is extended or adjusted under 35 U.S.C. 154(b) by 485 days.

(21) Appl. No.: 18/356,478

(22) Filed: Jul. 21, 2023

(65) Prior Publication Data

US 2024/0195374 A1 Jun. 13, 2024

Related U.S. Application Data

(60) Provisional application No. 63/431,924, filed on Dec. 12, 2022.

(51) Int. Cl.
*H03F 3/45* (2006.01)
*H03G 3/30* (2006.01)

(52) U.S. Cl.
CPC .......... *H03G 3/30* (2013.01); *H03F 3/45197* (2013.01); *H03G 2201/103* (2013.01)

(58) Field of Classification Search
CPC .. H03G 3/30; H03G 2201/103; H03G 1/0029; H03G 3/3084; H03F 3/45197; H03F 2203/45008; H03F 2203/45418; H03F 2203/45424; H03F 2203/45471; H03F 1/083; H03F 3/087; H03F 3/45201; H03F 3/45475; H03F 3/4565
USPC .......................................................... 330/254
See application file for complete search history.

(56) References Cited

U.S. PATENT DOCUMENTS 5,613,233 A * 3/1997 Vagher ................ H03D 7/1433 455/296
10,958,230 B2 3/2021 Vera Villarroel et al.
2019/0199290 A1 6/2019 Karmaker et al.
2020/0092010 A1* 3/2020 Vera Villarroel ... H03F 3/45475

FOREIGN PATENT DOCUMENTS

JP 2015207923 A 11/2015

OTHER PUBLICATIONS

Li et al, "A low-noise design technique for high-speed CMOS optical receivers", JSSC 2014.
Gilbert, "The multi-tanh principle: a tutorial overview", JSSC 1998.
Ahmed et al "34-GBd Linear Transimpedance Amplifier for 200-GB/s DP-16-QAM Optical Coherent Receivers", IEEE JSSC 2019.

* cited by examiner

*Primary Examiner* — Jessica Han
*Assistant Examiner* — Khiem D Nguyen
(74) *Attorney, Agent, or Firm* — Stratford Group Ltd.

(57) ABSTRACT

An apparatus, e.g., an optical signal receiver, includes a trans-impedance amplifier (TIA) circuit. The TIA circuit includes a variable gain amplifier (VGA) having a tunable tail current source. The TIA circuit is configured to tune the tail current source to stabilize a DC current to a load resistor of the VGA over an operating gain range of the TIA circuit.

12 Claims, 6 Drawing Sheets

VCCS + CURRENT MIRROR

BASE VOLTAGE CONTROL

VARIABLE-DEGENERATION CURRENT MIRROR

METHOD FOR VARYING AMPLIFIER GAIN

This application claims priority from the U.S. Provisional Patent Application No. 63/431,924, filed on Dec. 12, 2022, which is incorporated herein by reference in its entirety.

FIELD

Various example embodiments relate to circuits and methods for trans-impedance amplifiers and optical receivers using trans-impedance amplifiers.

BACKGROUND

Trans-impedance amplifiers (TIAs) are used in high speed fiber optic communication systems. TIAs provide a link between the optical-to-electrical photo detectors (PD), and the downstream electronics. A TIA converts the current coming from the PD into a voltage, thus providing transimpedance gain (ZT). This voltage is typically fed to an ADC, and the resulting signal may be processed in the digital domain. The TIA is desirably linear and has a well-controlled gain, in the relevant operating range, so that the ADC receives a voltage that is a linear representation of the current from the PD and has a magnitude that matches the dynamic range of the ADC.

SUMMARY

An aspect of the present disclosure provides an apparatus. Embodiments of the apparatus comprise a trans-impedance amplifier (TIA) circuit, the TIA circuit comprising a variable gain amplifier (VGA). The VGA is configured to tune a tail current source to stabilize a DC current to a load resistor of the VGA over an operating gain range of the TIA circuit.

In any of the embodiments, the VGA may comprise an amplification stage and a current steering structure to selectably steer a fraction of the current output by the amplification stage to the load resistor. The VGA may be operable to cause the structure to vary said fraction.

Any of the embodiments may comprise a controller configured to increase a DC current from the tail current source in response to a fraction of an electrical current flowing to the load resistor decreasing.

Some of the embodiments may comprise a feedback loop configured to adjust the tail current source by comparing an output DC voltage of the VGA to a reference voltage. In any of such embodiments, the feedback loop may be configured to maintain an output DC voltage of the VGA substantially constant. In some of such embodiments, the VGA may have differential outputs, with the output DC voltage being a common mode voltage.

In any of the embodiments, the VGA may be a differential VGA comprising two current-steering circuits connecting to a differential amplification stage, the differential amplification stage connecting to one or more variable current sources.

In some of the embodiments, the VGA may comprise the tail current source and the load resistor. Some of such embodiments may comprise a feedback loop configured to adjust the tail current source responsive to an output DC voltage of the VGA and a reference voltage. In some of such embodiments, the VGA may have differential outputs, with the DC output voltage being a common mode voltage, and the feedback loop may be configured to compare the DC output voltage to a reference voltage. In some of such embodiments, the VGA comprises an amplification stage and the tail current source, the tail current source being tunable by the feedback loop to vary a DC electrical current biasing the amplification stage.

Any of the embodiments may comprise a coherent optical receiver including a photodetector pair, wherein the output of each photodiode is connected to an input of the TIA circuit.

BRIEF DESCRIPTION OF THE DRAWINGS

Embodiments disclosed herein will be described in greater detail with reference to the accompanying drawings which represent preferred embodiments thereof, in which like elements are indicated with like reference numerals, and wherein.

DESCRIPTION

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits may be omitted so as not to obscure the description of the present invention. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Furthermore, the following abbreviations and acronyms may be used in the present document:

ADC: Analog to Digital Converter

AGC: Automatic Gain Control

Av: voltage gain

CE: emitter degeneration capacitance

Figure 1:
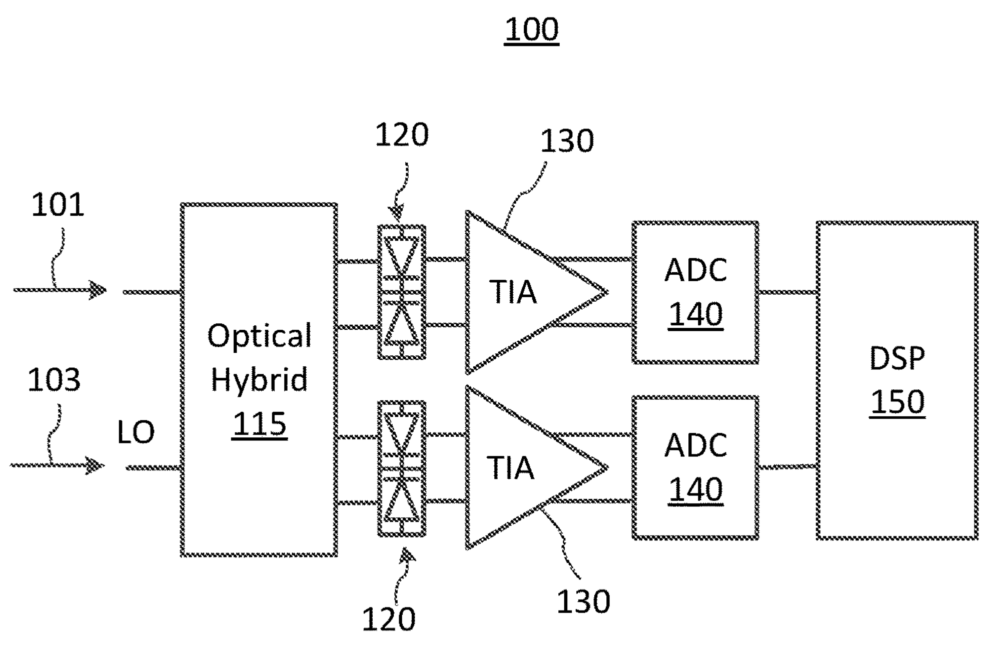
FIG. 1 is a schematic block diagram of a coherent optical receiver where the TIA(s) of the present disclosure may be used.

DSP: Digital Signal Processing
FET: Field Effect Transistor
RE: emitter degeneration resistance
TIA: TransImpedance Amplifier
VGA: Variable Gain Amplifier
BW: BandWidth
ZT: trans impedance FIG. 1 illustrates a block diagram of an example coherent optical receiver 100 to which embodiments of the present disclosure may relate. An optical signal 101 received from an optical communication link (not shown) is mixed with local oscillator (LO) light 103 in an optical hybrid 115. Different mixtures of the optical signal and LO light from four output ports of the optical hybrid are transmitted to two serially connected, photodiode (PD) pairs 120. Each serially connected pair of PDs 120 may be suitably biased. The two PDs of a pair 120 measure mixtures of the received optical signal light 101 with LO light 103 with different relative phase shifts. The signals from the two PDs of a pair 120 are coupled to the differential inputs of a corresponding trans-impedance amplifier (TIA) 130. Differential outputs of the TIAs 130 are provided to respective ADCs 140, which are, in turn, connected to a DSP 150 for signal processing and data de-modulation.

Figure 2:
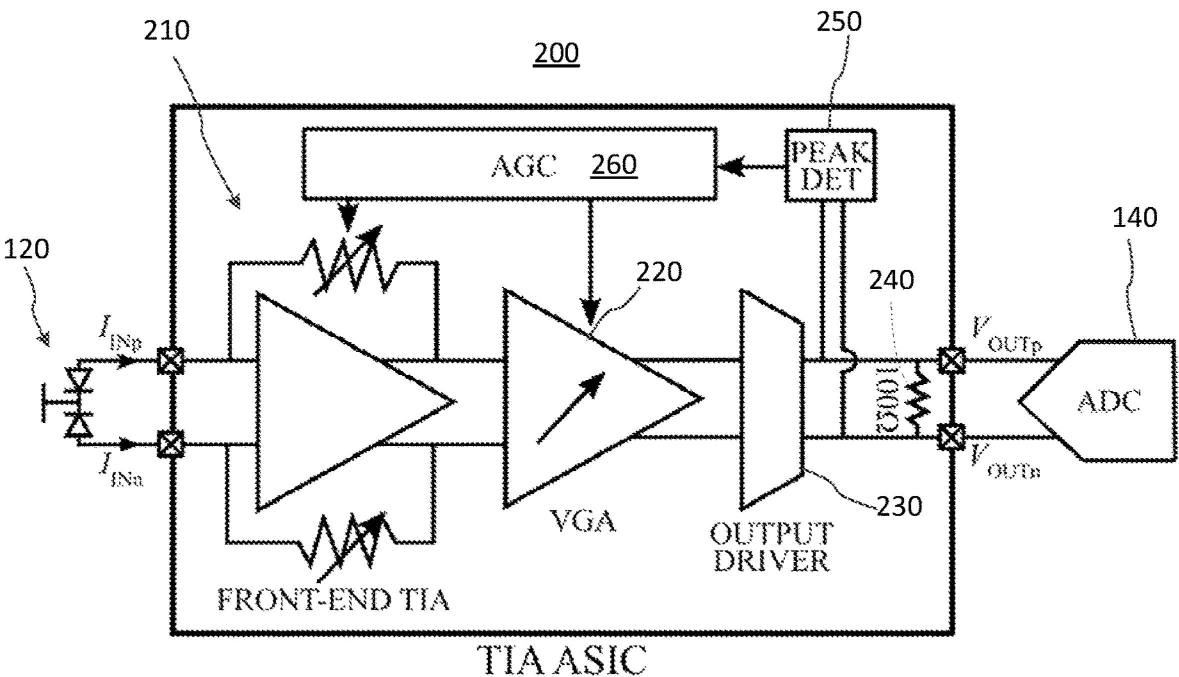
FIG. 2 is a schematic block diagram of a TIA circuit that may be used in the coherent optical receiver of FIG. 1.

A block diagram of a typical TIA circuit 200, which may be implemented e.g., as an Application-Specific Integrated Circuit (ASIC), is shown in FIG. 2. It includes a front-end TIA (FE-TIA) 210, which converts PD current(s) $I_{INp}$, $I_{INn}$ from a PD pair 120 into a voltage signal, followed by a series of one or more Variable Gain Amplifiers (VGA) 220 to provide further voltage amplification, and an output driver 230. The output driver 230 is typically a transconductor, which drives an on-chip termination resistor 240 as well as being connected to the inputs of the ADC. The TIA circuit 200 may also include a peak detector 250 to measure the output swing, and an Automatic Gain Control (AGC) loop 260, which adjusts the TIA gain in order to keep the peak output swing at a desired value in the presence of slow variations of the swing of the currents $I_{INp}$, $I_{INn}$ input to the TIA circuit 200.

For the coherent optical receiver 100 illustrated in FIG. 1, the amplitude of an input signal to each TIA 130 can vary by an order of magnitude (20 dB) or more due to events in the optical network. Such events can substantially change the optical signal propagating to an optical receiver, typically at a rate much lower than the baud rate or symbol rate of the optical signal 101. In response to such events, gain of the TIA circuit 200 may be adjusted by the AGC 260, so that the amplitude of the output signal remains about constant and remains within a desirable operating range of the ADC 140 connected to receive the output signals $V_{OUTp}$, $V_{OUTn}$ of the TIA circuit 200.

Gain adjustment in a TIA circuit may be done in part using one or more VGAs 220 that typically follow the FE-TIA in the TIA's signal processing chain, as illustrated in FIG. 2. Preferably, a VGA is designed to vary the signal gain while keeping other performance metrics (bandwidth, noise, linearity) as constant as possible. In a TIA with an AGC, it is usually desirable to keep an output-referred linear range about constant in light of such gain variations. The term "output-referred linear range" means a range of output voltage amplitude values within which an output signal is an approximately linear function of the input signal. Here, "approximately linear" means linear with accuracy suitable for a particular application, as typically specified by a selected nonlinearity measure of the amplifier signal response being smaller than a threshold value, e.g., the quantization of measured values by an ADC. By way of example, the amplifier operation may be referred to as "approximately linear" when a total harmonic distortion (THD) of the output signal is smaller than a specified threshold value, e.g., less than 5%, or less than 2% in some embodiments. The term "input-referred linear range" means a range of input voltage amplitude values within which the amplifier response is approximately linear as defined above. An AGC feedback loop can adjust the signal gain in a manner that ensures that the TIA circuit output swing remains about constant at a target amplitude value, irrespective of much longer time-scale variations in the average input signal amplitude. The output signal amplitude should desirably remain within the amplifier's approximate linear range in the presence of changes to the TIA gain.

The above-described desirable properties can be challenging to achieve when setting a VGA to an about minimum gain. If we define a target output-referred linear range as Aout,lin and the VGA gain as Av, the VGA input-referred linear range is given by Ain,lin=Aout,lin/Av. As a result, Ain,lin increases inversely proportionally to the gain, resulting in challenging linearity specifications near the minimum gain.

For example, for a VGA with variable gain between 0 dB (1×) and 20 dB (10×), at maximum gain Ain,lin=Aout,lin/10, while at minimum gain Ain,lin=Aout,lin.

Another desirable property is that the VGA output DC bias should not vary significantly with gain. In embodiments where the signal processing chain of the TIA circuit is typically DC coupled, a variation of the DC bias might have a detrimental effect on the operation of the subsequent amplifier blocks.

Figure 3:
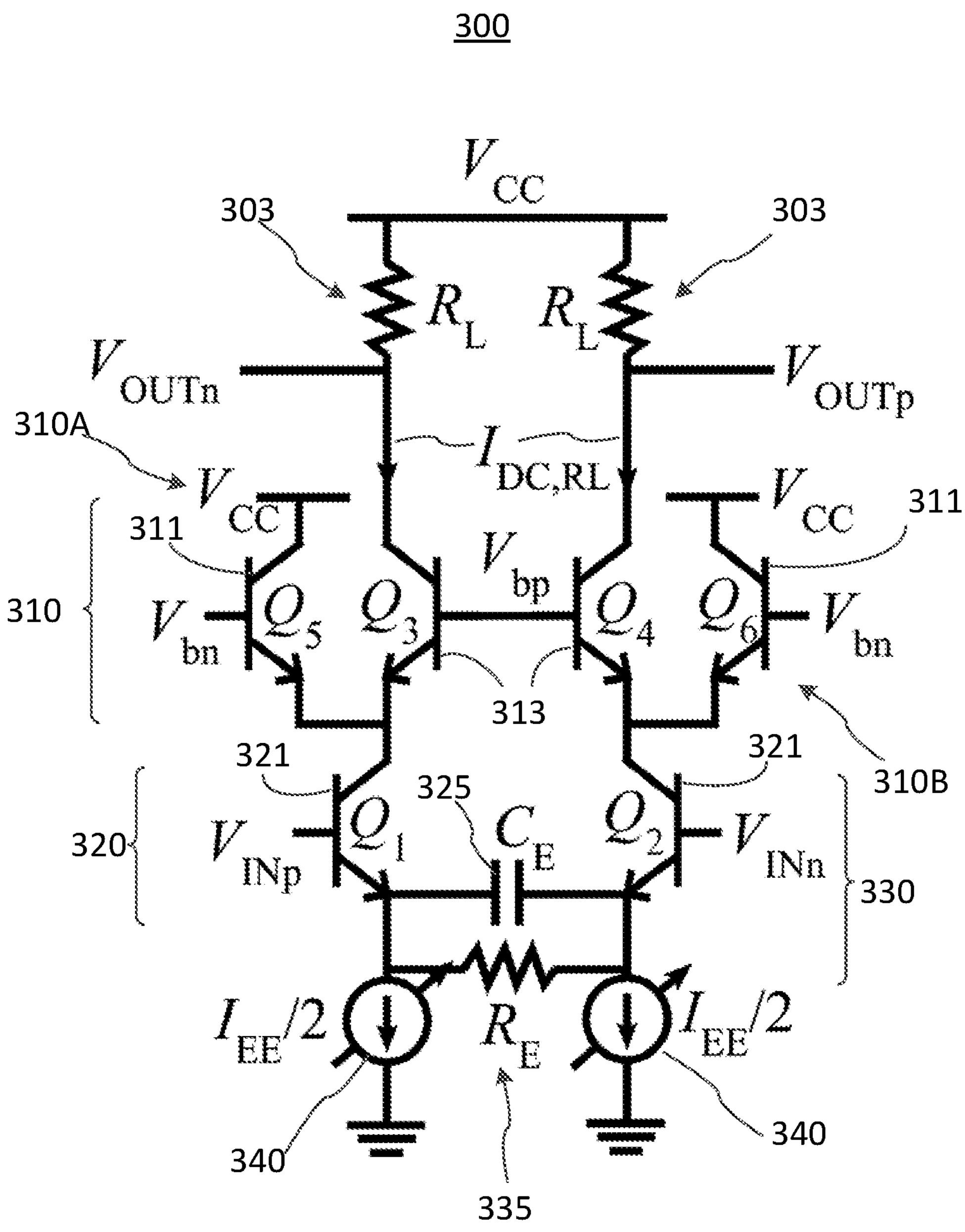
FIG. 3 shows a VGA circuit for use in the TIA of FIG. 1 or FIG. 2.

FIG. 3 illustrates an example VGA 300 that may be used in a TIA circuit such as TIA 200, e.g., for high-speed TIAs. The VGA 300 has a differential cascode topology and includes current steering circuits 310A, 310B for gain tuning. At maximum gain, transistors 311 (labeled $Q_5$ and $Q_6$ in FIG. 3) of the current steering circuits 310A and 310B are turned off by setting a base voltage bias $V_{bn}$ to a value significantly lower than a base voltage bias $V_{bp}$, e.g., lower by 200 mV or more, and approximately all signal current flows to the load resistor(s) 303, with a load resistance value $R_L$, through transistors 313 (labeled $Q_3$ and $Q_4$ in FIG. 3). To reduce the gain of the VGA 300, the base voltage Von of the transistors 311, $Q_5$ and $Q_6$, is increased to turn those transistors on, thereby steering a part of the signal current from the transistors 321, labeled $Q_1$ and $Q_2$ in FIG. 3, away from the load resistor $R_L$ 303. The current steering circuits 310A, 310B may be commonly referred to as the current steering structure 310.

If the DC current(s) through the transistors 321, $Q_1$ and $Q_2$, remain constant when the base voltages $V_b$ change, the common-mode DC signal at the output of the VGA 300, e.g the DC current $I_{DC,RL}$ through the load resistors(s) $R_L$ 303, varies as the fraction of the DC current from the transistors 321, $Q_1$ and $Q_2$, that is steered to the load 303 changes, hence the output DC bias varies with gain.

Furthermore, if the tail current $I_{EE}$ of the VGA 300 remains constant as the VGA gain is adjusted, the output-referred linear range may degrade at low gain. In some approximation, the range in which the transfer characteristic of the circuit of FIG. 3 remains approximately linear ("linear range") is mostly set by the input degenerated differential pair transconductor 330 ($Q_1/Q_2/R_E$), which has an input linear range approximately proportional to $R_E*I_{EE}$, where $I_{EE}$ is the tail DC current of the input stage 320 of the VGA 300, i.e., of the $Q_1/Q_2$ transistor pair, and the emitter degeneration resistor 335, with the degeneration resistance value $R_E$. Here, "tail DC current(s)" refers to the DC current(s) biasing the input stage 320 of the VGA 300 and sourced from a DC current source ("tail current source") that is connected, e.g., to the emitter(s) (source(s) in FET-based embodiments) of the input stage 320. Therefore, the input linear range Ain,lin is approximately constant over gain, and as a result the output linear range Aout,lin=Av*Ain,lin decreases proportionally to the gain Av. As a second-order effect, the current steering structure 310 ($Q_3/Q_4/Q_5/Q_6$) may also affect the linearity at low gain, so the output linear range is degraded further.

In order to at least partially correct for these drawbacks of a conventional current-steering VGA, the VGA 300 of FIG. 3 includes one or more variable current sources 340 for varying the tail DC current $I_{EE}$. In an embodiment, the tail DC current $I_{EE}$ may be varied in response to, or in parallel with, varying the base voltage $V_{bn}$, so as to keep the DC current $I_{DC,RL}$ through the load resistor(s) $R_L$ 303 approximately constant over a target range of the VGA gain variations. Furthermore, keeping the DC current through the load resistor(s) $R_L$ 303 approximately constant may also lessen the degradation of the output-referred linear range of the VGA 300 at low gain.

By way of example, in order to change the VGA gain by a factor of 1/k through current steering, i.e., reduce k times, k>1, both the signal (AC) and DC current through transistors 313, $Q_3$ and $Q_4$, is reduced k times by suitably varying the base voltage Von, or the base voltage difference ($V_{bn}$-$V_{bp}$), to steer the remaining current through the transistors 311, $Q_5$ and $Q_6$. To keep the DC current through the transistors 313, $Q_3$ and $Q_4$, constant, $I_{EE}$ is increased by k times. As a result, the input linear voltage range of the input gain stage, which is given approximately by a product $I_{EE}*R_E$, increases by a factor of k. Therefore, the output linear range Aout, lin=Av·Ain,lin of the VGA 300 is approximately independent of k, so that the degradation of the output linear range at low gain values is absent or at least lessened.

Furthermore, in the VGA 300 of FIG. 3 the resistance $R_E$ of the degeneration resistor 335, and the capacitance $C_E$ of a capacitor 325, when present, may have constant values independent on the VGA gain. In some embodiments, e.g., in high-speed TIAs, one or more VGA stage(s) may be used as an equalizer to somewhat expand the BW of the FE-TIA (e.g., 210, FIG. 2). For equalization, the capacitor $C_E$ 325 is typically placed between the emitters of the transistors 321, $Q_1$ and $Q_2$, in parallel with the resistor $R_E$ 335, to create some amount of high-frequency peaking. The amount of peaking is a function of the $R_E*C_E$ product. As a result, if the resistance $R_E$ of the resistor 335 varies versus gain, so typically does high frequency peaking, which is undesired. One possible solution is to make the $C_E$ tunable by using a varactor; however, adjusting the value of $C_E$ to account for the $R_E$ variations may interfere with using the $C_E$ tuning as an extra degree of freedom to adjust the amplifier bandwidth, which may also be a desired feature, e.g., in high-speed TIAs. Advantageously, the tuning of the VGA gain in the embodiment of FIG. 3 may be performed by tuning the source(s) 340 of the tail DC current $I_{EE}$, without tuning either the $R_E$ or the $C_E$.

In an embodiment, the value $R_E$ of the degeneration resistor 335 may be selected so that $$R_E >> 1/gm_{Q12}. \quad (1)$$

Here, $gm_{Q12}$ is the transconductance of the transistors 321, $Q_1$ and $Q_2$, which may depend on the tail DC current $I_{EE}$. The transconductance Gm of the degenerated differential transistor pair 320, which is approximately given by $Gm=gm_{Q12}/(1+gm_{Q12}*R_E)$, may be approximated as $Gm=1/R_E$ when condition (1) holds, and therefore Gm is approximately independent of the DC current flowing through the differential transistor pair 320. Linear transconductors employing bipolar devices, such as the ones used in most high-speed TIAs, are known to use resistive degeneration with $R_E>>1/gm$. By way of example, the product ($R_E$·gm) may be about or greater than 5, or preferably about or greater than 10, e.g., in a range between 10 and 100.

The above description relates to an impact on the VGA linearity by the input stage 320 of the VGA, i.e., the degenerated differential transistor pair $Q_1$, $Q_2$. In some embodiments the linear range of the VGA 300 may also be affected by transistors $Q_3/Q_4/Q_5/Q_6$, whose linearity may decrease at low gain. However, this is a second-order effect, and the dominant contribution to linearity distortion is typically the input differential pair 320. As a result, although the example VGA circuit 300 of FIG. 3 may not achieve a perfectly constant output linear range, the VGA circuit 300 of FIG. 3 is expected to enable lessening the sensitivity of the output linear range to VGA gain setting compared to some conventional current-steering amplifiers.

Figure 4:
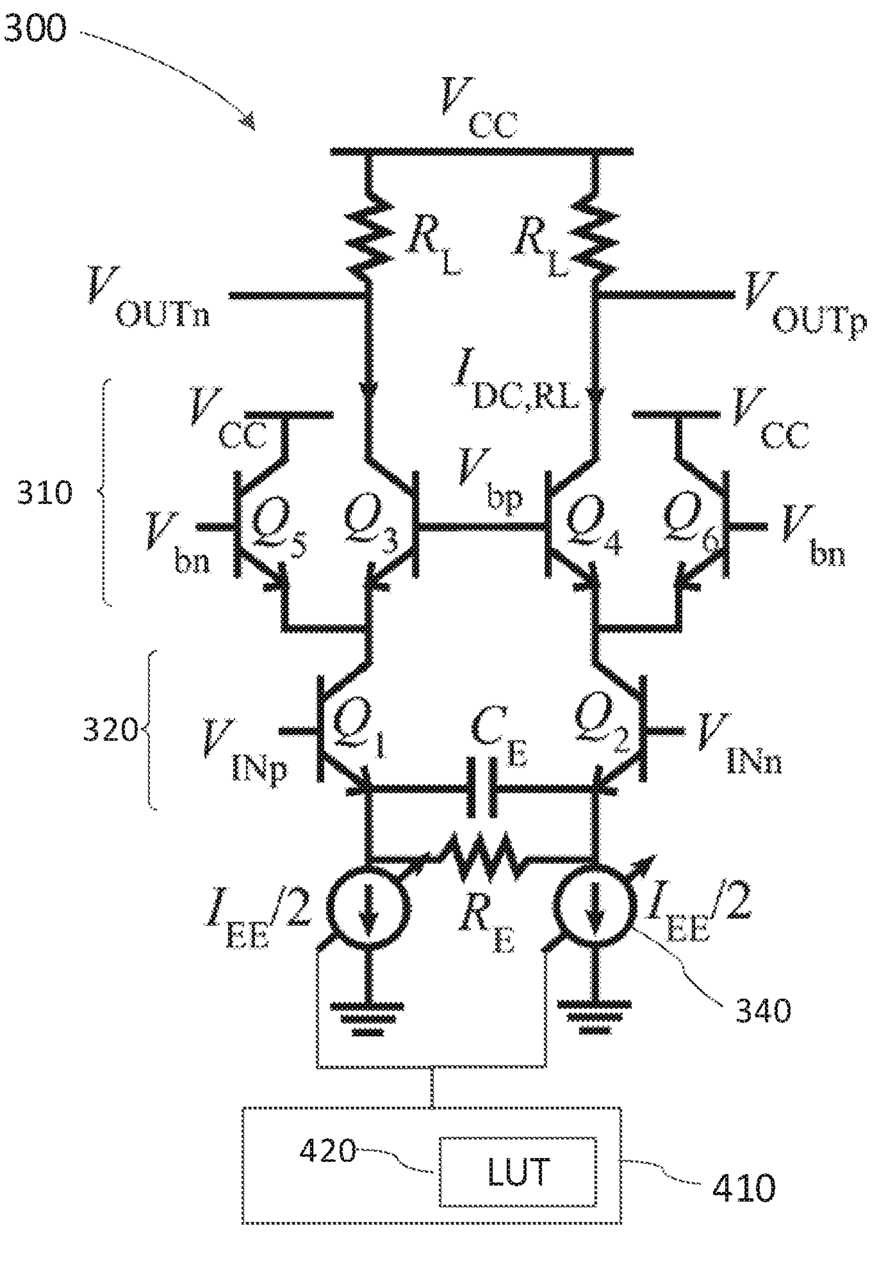
FIG. 4 shows the VGA circuit of FIG. 3 with a controller for controlling the tail current source(s) according to an embodiment.

Referring to FIG. 4, in some embodiments, the tail DC current $I_{EE}$ may be adjusted by an external controller 410 that is configured to vary, e.g., the base voltages $V_{bn}$, and possibly $V_{bp}$, simultaneously with controlling the tail current source(s) 340 to vary the tail DC current $I_{EE}$ so as to keep the DC current $I_{DC\_RL}$ through the load resistor(s) $R_L$ 303 constant. In an embodiment, the controller 410 may include memory 420 storing a look-up table (LUT) relating VGA gain setting to the Von and $I_{EE}$ values.

Figure 5:
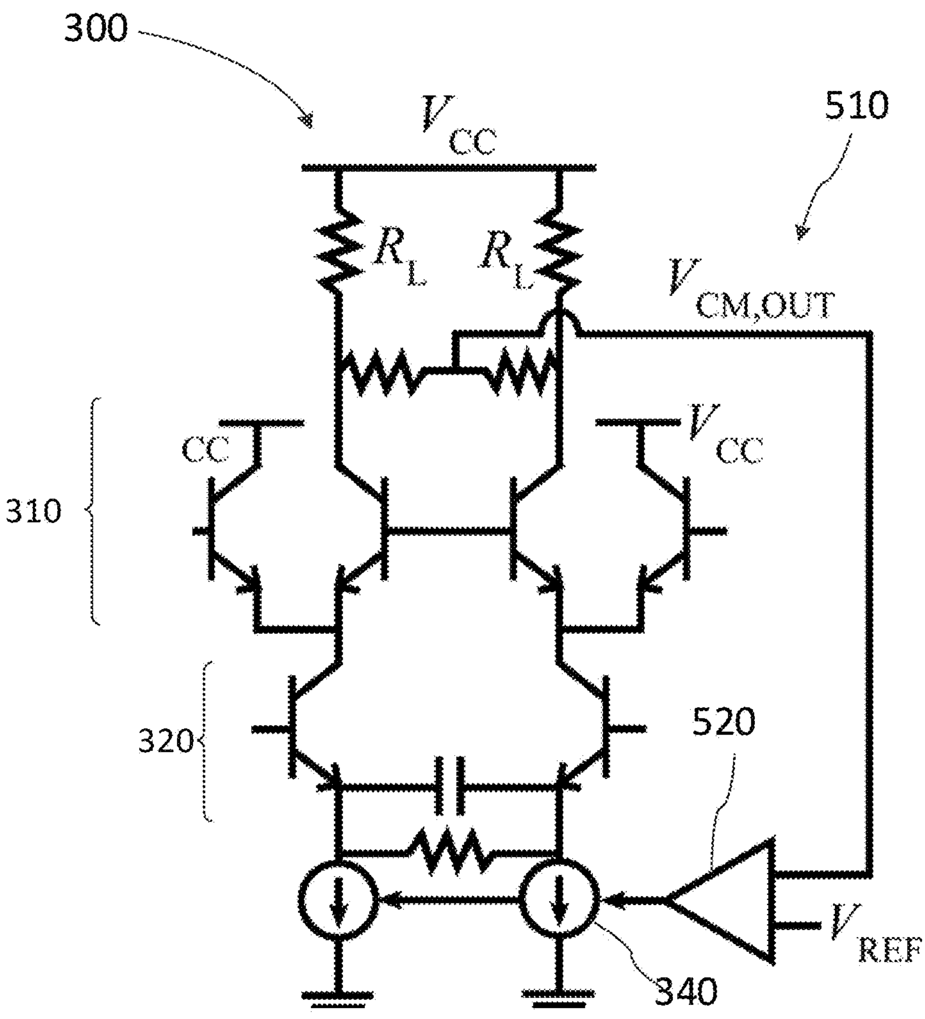
FIG. 5 is a circuit diagram illustrating the VGA circuit of FIG. 3 with a closed-loop control of the tail DC current.

Referring to FIG. 5, in some embodiments the tail DC current $I_{EE}$ can be adjusted using a feedback loop 510, which includes an operational amplifier 520 as a comparator, and which keeps an output common-mode DC bias of the VGA 300, $V_{CM,OUT}$, to be approximately equal to a constant reference voltage $V_{REF}$. Since the output common-mode voltage is given approximately by $V_{CM,OUT}=V_{CC}-R_L*I_{DC,RL}$, and the $R_L$ is largely independent of the VGA gain, adjusting the tail DC current $I_{EE}$ in this manner also ensures that the DC load current $I_{DC,RL}$ is kept about constant as the gain varies.

Figure 6:
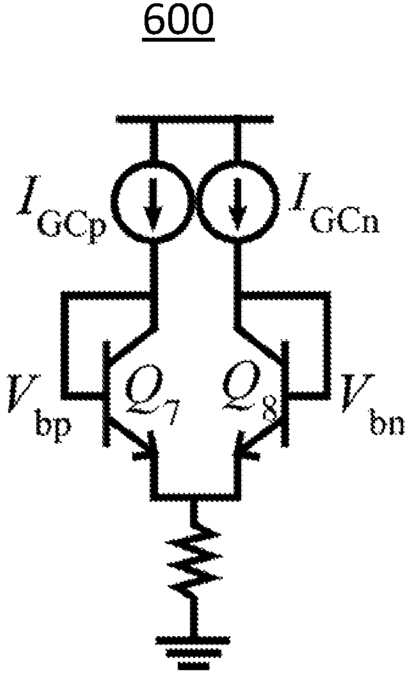
FIG. 6 shows an example base voltage bias circuit for use in the VGA of any of the circuits shown in FIGS. 3 to 5.

FIG. 6 shows an example circuit 600 that may be used to generate the bias voltages $V_{bp}$, Von of the current steering circuits 310A, 310B in the TIA circuits of FIG. 3, FIG. 4, or FIG. 5. Transistors $Q_7$ and $Q_8$ function as a replica of the transistors $Q_3/Q_4$ and the transistors $Q_5/Q_6$, respectively (see FIG. 3). The ratio between currents $I_{GCp}$ and $I_{GCn}$ sets the ratio of the current flowing through the main signal path in the VGA 300 (the transistors $Q_3/Q_4$) to the current through the dummy path (the transistors $Q_5/Q_6$), and therefore also sets the VGA gain.

The tail current source 340 may be implemented, e.g., with a transistor combined with an emitter degeneration resistance, as typically done for bipolar current sources. However, the emitter degeneration resistance within the current source affects primarily the DC current $I_{EE}$ from the source, and approximately does not affect an AC transconductance of the input stage 320 (the input differential transistor pair $Q_1$, $Q_2$ in FIGS. 3 and 4).

Figure 7:
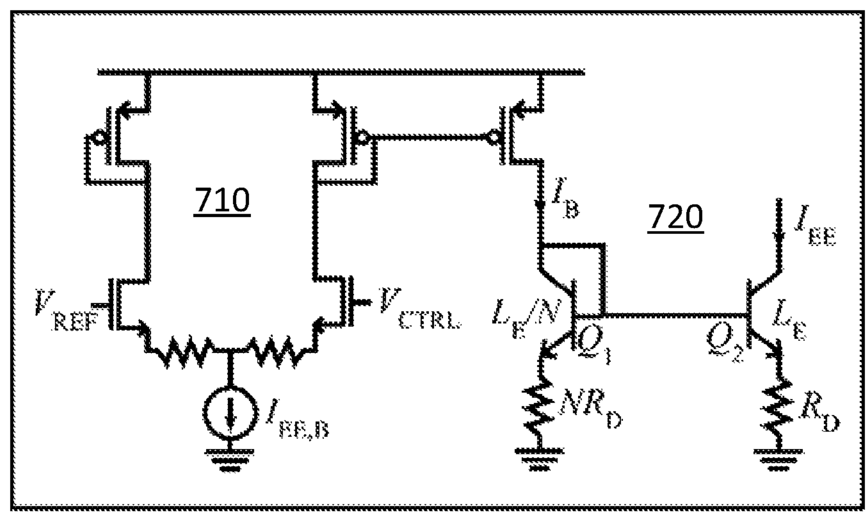
FIG. 7 shows an example tunable current source including a voltage-controlled current source and a current mirror for use in the VGA of any of the circuits shown in FIGS. 3 to 5.
Figure 8:
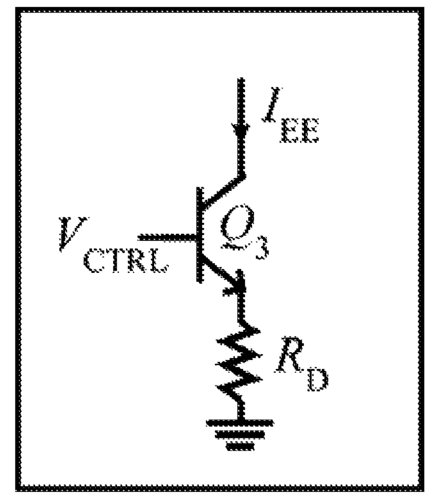
FIG. 8 shows an example tunable current source including a degenerated bipolar transistor with variable base voltage for use in the VGA of any of the circuits shown in FIGS. 3 to 5.
Figure 9:
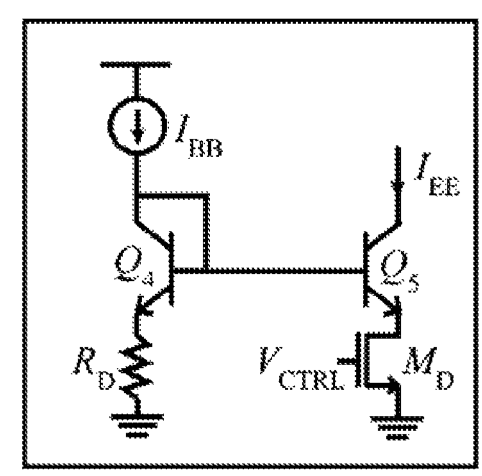
FIG. 9 shows an example tunable current source including a current source with variable degeneration resistance for use in the VGA of any of the circuits shown in FIGS. 3 to 5.

FIGS. 7, 8, and 9 illustrate example circuit implementations of the variable tail current source(s) 340 shown in FIGS. 3-5. In each of these circuits, a variable DC current $I_{EE}$ may be tuned by tuning a control voltage $V_{CTRL}$. One option is to use a voltage-controlled-current source (VCCS) 710 followed by a multiplying current mirror 720 (transistors $Q_1$ and $Q_2$ in FIG. 7), as illustrated in FIG. 7. The VCCS 710, implemented for example as a degenerated differential pair with a diode-connected load, compares the control voltage $V_{CTRL}$ to a reference voltage $V_{REF}$, to provide a tunable current $I_B$ to the current mirror 720. In some voltage range around the $V_{REF}$, the current $I_B$ is approximately linearly proportional to a voltage difference ($V_{CTRL}-V_{REF}$). The current mirror 720 then outputs the tail current $I_{EE}=N*I_B$, where the multiplication factor N is given by the ratio of transistor emitter lengths and degeneration resistors of the current mirror.

In the current source of FIG. 8, the voltage $V_{CTRL}$ is used to control the base of a degenerated bipolar transistor $Q_3$. Since the base-emitter voltage $V_{BE}$ of a bipolar transistor is approximately constant versus collector current variations, the current $I_{EE}$ is approximately given by $(V_{CTRL}-V_{BE})/R_D$.

The current source of FIG. 9 includes a current mirror with variable degeneration resistance (transistor $M_D$), biased with a fixed current $I_{BB}$. Here the reference transistor of the mirror ($Q_4$) is degenerated by a fixed resistor $R_D$, while the output transistor ($Q_5$) is degenerated by a variable resistor, e.g., implemented with a FET transistor $M_D$ biased in the triode region, whose source-drain resistance is a function of gate voltage $V_{CTRL}$. As a result, the ratio $I_{EE}/I_{BB}$ is approximately given by the ratio between resistor $R_D$ and the source-drain resistance of $M_D$, which in turn is a function of $V_{CTRL}$ It will be understood by one skilled in the art that various changes in detail may be affected in the described embodiment without departing from the spirit and scope of the invention as defined by the claims. For example, although the example embodiments illustrated in FIGS. 3, 4, and 5 have a differential input to differential output configuration, other embodiments may have single input to differential output configuration, single input to single output (SISO) configuration, or a differential input to single output configuration. In case of a SISO configuration, the degeneration resistor 335 may be connected between the emitter of the input transistor $Q_1$ and a capacitor creating an AC short to ground, or a voltage source replicating the DC bias point at the emitter of $Q_1$, so that only AC current and no DC current flows through the degeneration resistor 335 $R_E$. In another example, instead of using two identical tail current sources each generating current IEE/2, as shown in FIG. 3, the VGA may use one individual current source generating current IEE, connected to the mid-point of resistor 335 $R_E$. In another example, other gain variation techniques, such as tuning degeneration resistor 335 $R_E$ or load resistor 303 $R_L$, may be added in addition to current steering to extend the gain range of the VGA. In another example, any of the bipolar transistors from FIG. 3, FIG. 4, and FIG. 5 may be replaced with a FET transistor. In another example, degeneration capacitor 325 $C_E$ may be omitted, or may be made tunable. In another example, the proposed VGA may be used as a core amplification stage of a transimpedance amplifier (e.g., the FE-TIA block in FIG. 2), e.g., adding a feedback resistor between the outputs and inputs of the VGA.

The invention claimed is:

1. An apparatus, comprising:

a trans-impedance amplifier (TIA) circuit comprising a variable gain amplifier (VGA);

wherein the VGA comprises an amplification stage and a current steering structure to selectably steer a fraction of a current that is being output by the amplification stage to a load resistor;

wherein the VGA is operable to cause the current steering structure to vary said fraction;

and wherein the VGA is configured to tune a tail current source to stabilize a DC current to the load resistor of the VGA over an operating gain range of the TIA circuit.

2. The apparatus of claim 1, comprising a controller configured to increase a DC current from the tail current source in response to a fraction of an electrical current flowing to the load resistor decreasing.

3. The apparatus of claim 1, comprising a feedback loop configured to adjust the tail current source by comparing an output DC voltage of the VGA to a reference voltage.

4. The apparatus of claim 3, wherein the feedback loop is configured to maintain the output DC voltage of the VGA substantially constant.

5. An apparatus, comprising:

a trans-impedance amplifier (TIA) circuit comprising a variable gain amplifier (VGA), the VGA configured to tune a tail current source to stabilize a DC current to a load resistor of the VGA over an operating gain range of the TIA circuit;

wherein the VGA is a differential VGA comprising two current-steering circuits connecting to a differential amplification stage, the differential amplification stage connecting to one or more variable current sources.

6. The apparatus of claim 3, wherein the VGA has differential outputs; and wherein the output DC voltage is a common mode voltage.

7. The apparatus of claim 6, wherein the VGA is a differential VGA comprising two current-steering circuits connecting to a differential amplification stage, the differential amplification stage connecting to one or more variable current sources.

8. The apparatus of claim 1, wherein the VGA comprises the tail current source and the load resistor.

9. The apparatus of claim 1, comprising a feedback loop configured to adjust the tail current source responsive to an output DC voltage of the VGA and a reference voltage.

10. The apparatus of claim 9, wherein the VGA has differential outputs, and wherein the feedback loop is configured to compare the DC output voltage to the reference voltage, the DC output voltage being a common mode voltage.

11. The apparatus of claim 9, wherein the VGA comprises an amplification stage and the tail current source, the tail current source being tunable by the feedback loop to vary a DC electrical current biasing the amplification stage.

12. The apparatus of claim 1 comprising a coherent optical receiver including a photodetector pair connected to inputs of the TIA circuit.

* * * * *